United States Patent
Cai et al.

(10) Patent No.: US 9,236,240 B2
(45) Date of Patent: Jan. 12, 2016

(54) WAFER EDGE PROTECTION

(71) Applicant: GLOBALFOUNDRIES Singapore Pte. Ltd., Singapore (SG)

(72) Inventors: Qiaoming Cai, Clifton Park, NY (US); Wurster Kai, Dresden (DE); Chunyan Xin, Clifton Park, NY (US); Frank Jakubowski, Dresden (DE)

(73) Assignee: GLOBALFOUNDRIES SINGAPORE PTE. LTD., Singapore (SG)

(*) Notice: Subject to any disclaimer, the term of this patent is extended or adjusted under 35 U.S.C. 154(b) by 0 days.

(21) Appl. No.: 13/779,776

(22) Filed: Feb. 28, 2013

(65) Prior Publication Data

US 2014/0239454 A1 Aug. 28, 2014

(51) Int. Cl.
| | |
|---|---|
| *H01L 21/00* | (2006.01) |
| *H01L 21/02* | (2006.01) |
| *H01L 21/308* | (2006.01) |
| *H01L 21/762* | (2006.01) |

(52) U.S. Cl.
CPC ...... *H01L 21/02002* (2013.01); *H01L 21/3081* (2013.01); *H01L 21/762* (2013.01)

(58) Field of Classification Search
None
See application file for complete search history.

(56) References Cited

U.S. PATENT DOCUMENTS

| | | | | |
|---|---|---|---|---|
| 6,063,688 A | * | 5/2000 | Doyle et al. | 438/424 |
| 2006/0043066 A1 | * | 3/2006 | Kamp | 216/67 |

* cited by examiner

*Primary Examiner* — Alexander Ghyka
*Assistant Examiner* — Abdulfattah Mustapha
(74) *Attorney, Agent, or Firm* — Horizon IP PTE LTD

(57) ABSTRACT

A semiconductor device and a method for forming a device are presented. A wafer substrate having first and second regions is provided. The second region includes an inner region of the substrate while the first region includes an outer peripheral region from an edge of the substrate towards the inner region. A protection unit is provided above the substrate. The protection unit includes a region having a total width $W_T$ defined by outer and inner rings of the protection unit. The substrate is etched to form at least a trench in the second region of the substrate. The $W_T$ of the protection unit is sufficiently wide to protect the first region of the wafer substrate such that the first region is devoid of trench.

17 Claims, 11 Drawing Sheets

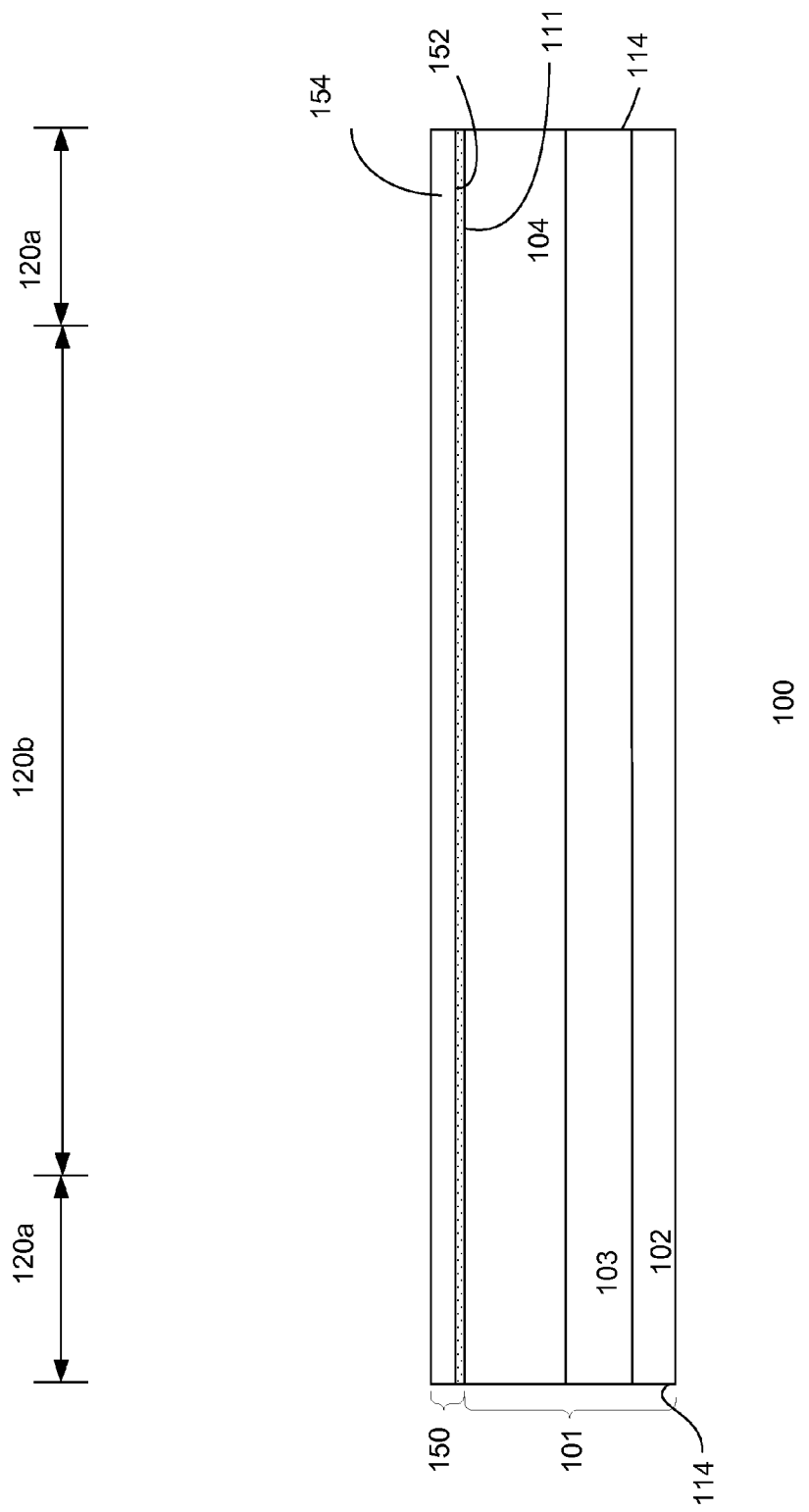

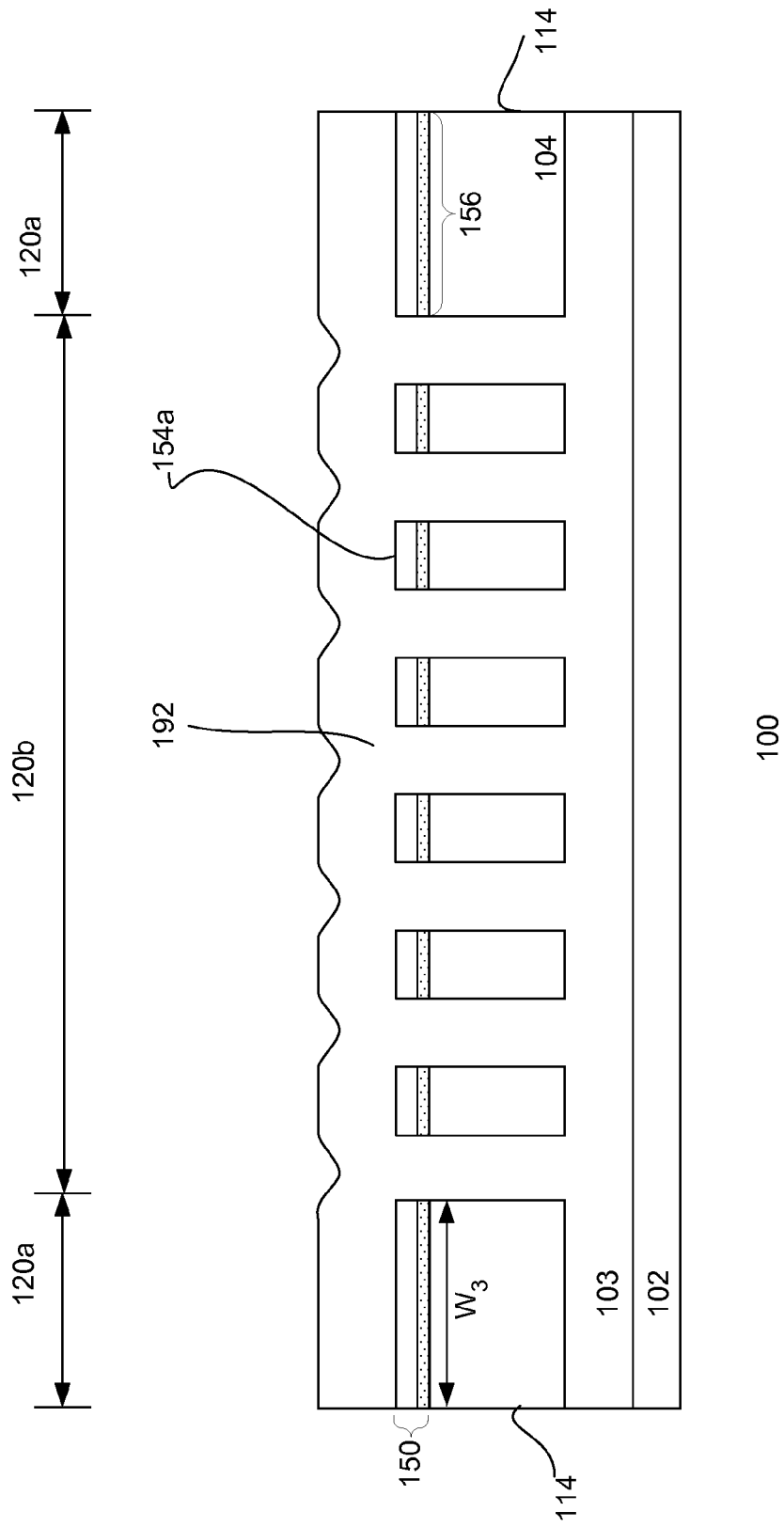

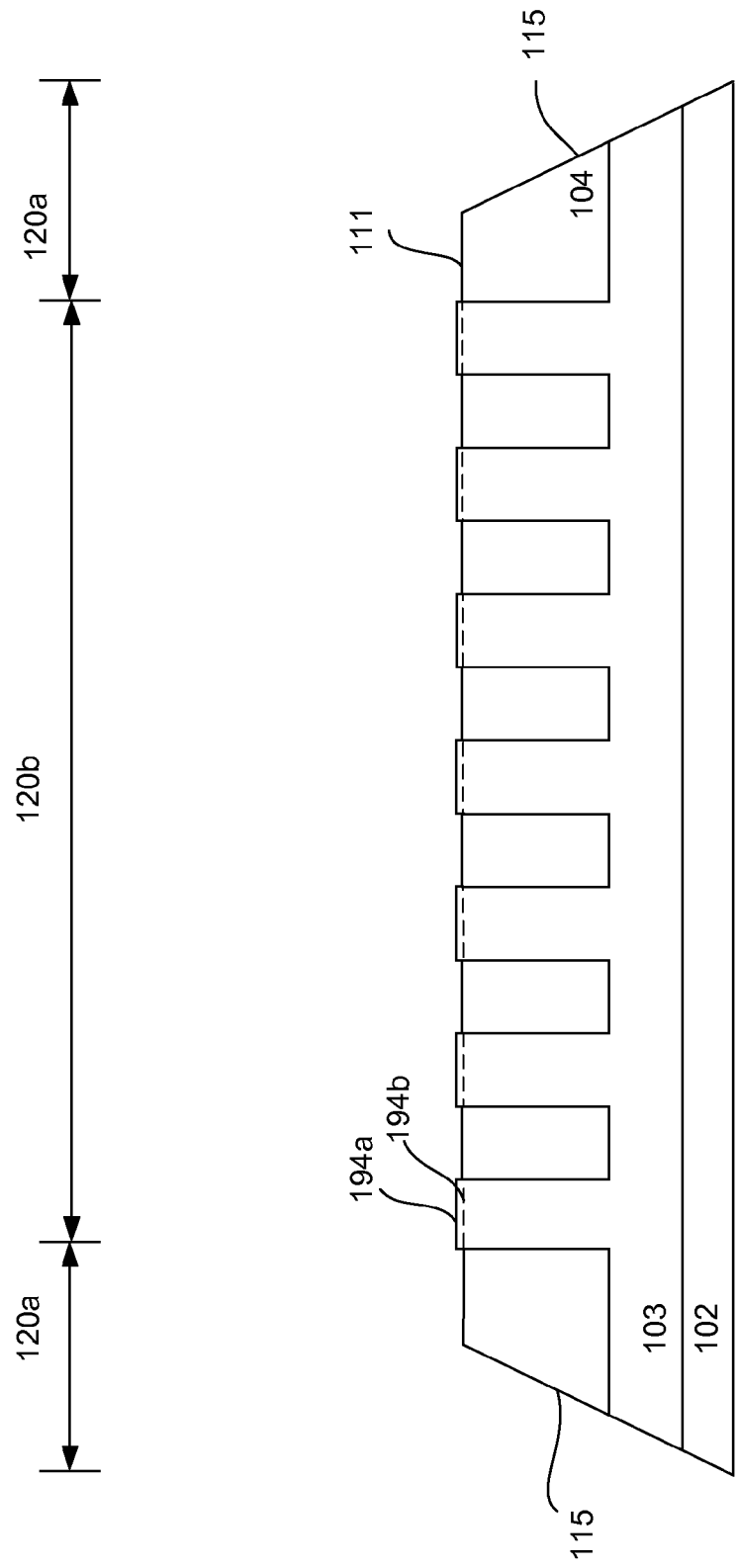

WAFER EDGE PROTECTION

BACKGROUND

In integrated circuits (ICs), various devices such as transistors, resistors, inductors, capacitors and varactors are configured to achieve the desired function. During fabrication of these devices, trenches are formed to provide electrical connections for devices or to isolate devices such that they operate independently without interfering with each other.

Nevertheless, materials at the edge of a wafer used for forming the ICs are undesirably removed during processing of the trenches. These materials will redistribute across the surface of the wafer, causing contamination. This will result in severe defects and yield loss.

From the foregoing discussion, it is desirable to provide a method which effectively prevents contamination of wafer, thereby avoiding defects in the ICs.

SUMMARY

Embodiments generally relate to semiconductor device and methods for forming semiconductor devices. In one embodiment, a method for forming a device is presented. A wafer substrate having first and second regions is provided. The second region includes an inner region of the substrate while the first region includes an outer peripheral region from an edge of the substrate towards the inner region. A protection unit is provided above the substrate. The protection unit includes a region having a total width $W_T$ defined by outer and inner rings of the protection unit. The substrate is etched to form at least a trench in the second region of the substrate. The $W_T$ of the protection unit is sufficiently wide to protect the first region of the wafer substrate such that the first region is devoid of trench.

In another embodiment, a semiconductor device is disclosed. The device includes a semiconductor substrate having first and second regions. The second region includes an inner region of the substrate and at least a trench structure while the first region includes an outer peripheral region from an edge of the substrate towards the inner region. The first region includes inclined side surfaces and is devoid of trench structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1a-j show an embodiment of a process for forming a semiconductor device;

DETAILED DESCRIPTION

Embodiments generally relate to semiconductor device and methods for forming semiconductor devices. The semiconductor devices include dies singulated from a wafer. In one embodiment, the method employs a protection unit to protect the edges of a wafer and to minimize or avoid contamination during processing. The devices, for example, may be any type of semiconductor devices, such as integrated circuits (ICs). The ICs can be incorporated into or used with, for example, electronic products, computers, cell phones, and personal digital assistants (PDAs). The devices may also be incorporated into other types of products.

Figure 1A:
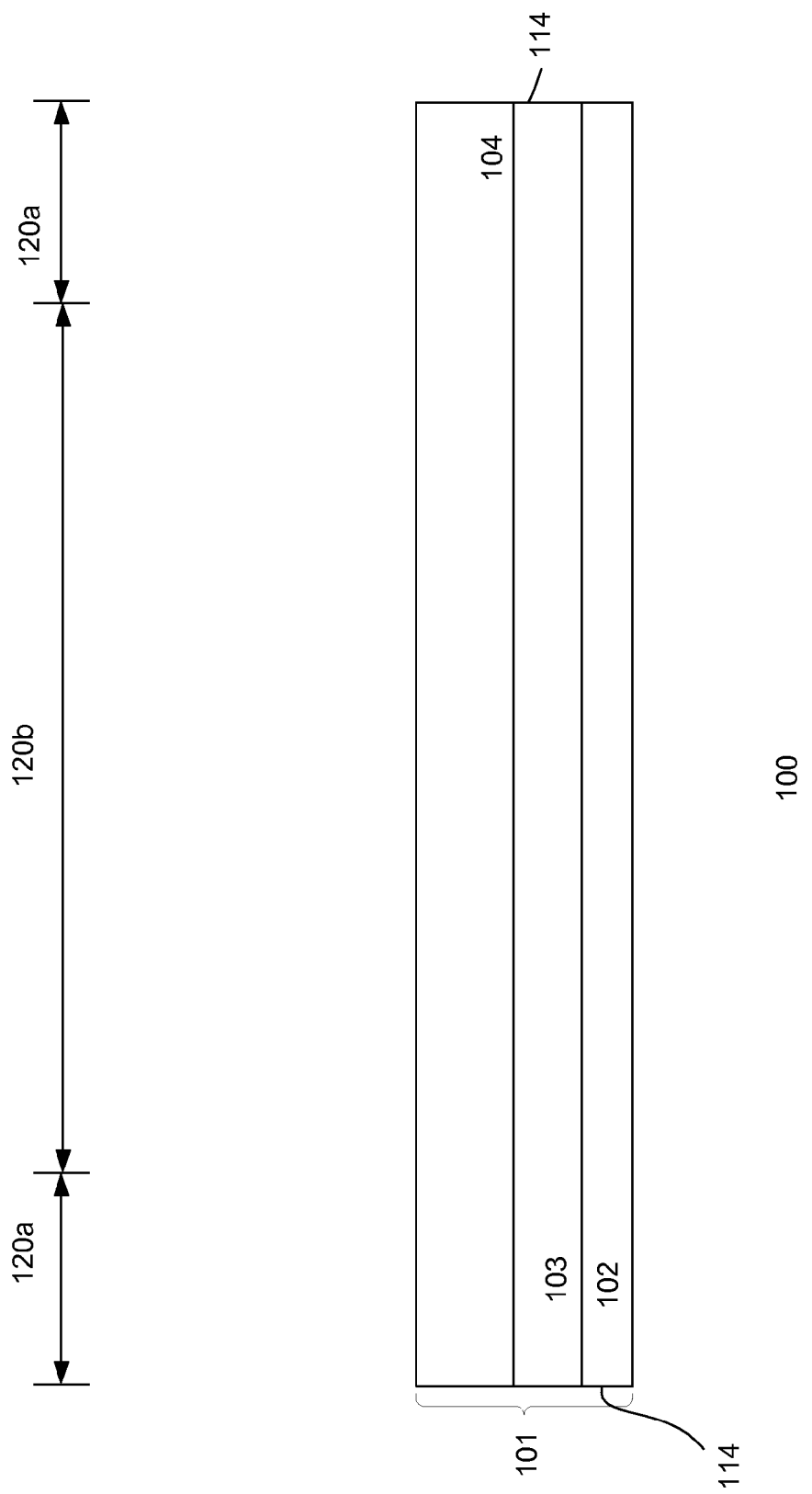

FIGS. 1a-j show cross-sectional views of an embodiment of a process for forming a semiconductor device. Referring to FIG. 1a, a wafer 100 is provided on which a plurality of ICs is formed. The wafer includes a wafer substrate 101. In one embodiment, the wafer substrate 101 may be a crystalline-on-insulator (COI) substrate. The COI substrate, for example, includes a crystalline surface layer separated from a crystalline bulk by an insulator layer. In another embodiment, the wafer substrate 101 may be a bulk semiconductor substrate. The bulk substrate may be a silicon substrate. Other types of substrates, such as germanium, silicon-germanium alloy, silicon-on-insulator (SOI), silicon-on-sapphire (SOS), are also useful.

For illustration, the wafer substrate 101 is shown as a COI substrate. As shown, the COI substrate includes a crystalline surface layer 104 separated from a crystalline bulk 102 by an insulator layer 103. The crystalline bulk 102 includes a semiconductor material. The semiconductor material, for example, includes single crystalline silicon. Other types of substrate materials, such as silicon-germanium (SiGe), germanium (Ge), gallium-arsenic (GaAs) or any other suitable semiconductor materials may also be useful. The thickness of the crystalline bulk, for example, is about 760 nm. Other suitable thicknesses may also be useful.

The insulator layer 103, for example, includes a dielectric insulating material. The insulator layer, for example, is formed from silicon oxide, providing a buried oxide (BOX) layer. Other types of dielectric insulating materials may also be useful. Various techniques, such as H implant or thermal oxidation using furnace annealing, may be employed to form the insulator layer. The thickness of the insulator layer, for example, is about 1000 Å. Other suitable thicknesses, materials and processes for forming the insulator layer may also be useful.

The crystalline surface layer 104, as shown in FIG. 1a, includes a semiconductor material. The semiconductor material, for example, includes single crystalline silicon. Thus, the COI substrate may be a silicon-on-insulator (SOI) substrate. Other types of COI substrates, such as silicon-germanium (SiGe), germanium (Ge), gallium-arsenic (GaAs) or any other suitable semiconductor materials may also be useful. In one embodiment, the crystalline surface layer and the crystalline bulk include the same material. Providing different materials for the crystalline surface layer and the crystalline bulk may also be useful. Typically, the thickness of the crystalline surface layer is about 1000 Å. Other suitable thicknesses may also be useful.

Referring to FIG. 1a, the wafer substrate 101 includes a first region 120a and a second region 120b. The first region 120a, for example, includes an outer or peripheral region from the edge 114 of the substrate and defines a non-functional chip region of which some ICs, such as non-functional ICs 110a are to be formed. The second region 120b, for example, includes an inner region of the substrate and defines a chip region of which ICs, such as functional ICs 110b, are to be formed.

Referring to FIG. 1b, the wafer substrate is prepared with a mask layer. The mask layer, for example, includes a hard mask 150. As shown, the hard mask includes a hard mask stack with a plurality of layers. The hard mask stack, in one embodiment, includes a first pad layer 152 and a second pad layer 154. The first pad layer 152 is formed on a first substrate surface 111. The first substrate surface 111, for example, may be referred to as a top surface of the substrate. The first pad layer serves to provide adhesion and relieve mechanical stress caused by mismatches between coefficients of thermal expansion of the substrate and overlying layers. The first pad layer, for example, also protects the substrate from contamination in later processing. Typically, the first pad layer includes silicon oxide. The first pad layer, for example, may be formed by various thermal treatments, such as rapid thermal processing (RTP) or furnace annealing. The thickness of the first pad layer, for example, is about 100 Å. Other suitable thicknesses, materials and processes for forming the first pad layer may also be useful.

The second pad layer 154 is formed on top of the first pad layer 152. The second pad layer includes a material which can be etched selectively to the substrate. In one embodiment, the second pad layer includes a material which can be etched selectively to the substrate as well as serving as a polish stop for a fill material to a trench later. In one embodiment, the second pad layer includes silicon nitride. Various techniques, such as RTP or furnace annealing, can be employed to form the second pad layer. The thickness of the second pad layer, for example, is about 1000 Å. Other suitable thicknesses, materials and processes for forming the second pad layer may also be useful.

Optionally, the hard mask stack can include a third or intermediate pad or hard mask layer (not shown). The third pad layer serves to reduce reflection due to the second pad layer. If suppression of reflectivity due to the second pad layer is not required, the third pad layer can be omitted. The third pad layer includes, for example, a bottom anti-reflective coating (BARC) layer, such as an organic material including polyimide or a polysulfone. The thickness of the BARC layer may be about 300 Å. Any suitable process may be used to form the third pad layer. An antireflective coating (ARC) layer (not shown) may be provided above the third pad layer. The ARC layer is used to reduce reflection during exposure, which can impair the quality of the image being patterned. The ARC layer includes, for example, an organic polymer having a thickness of about 1500 Å. Other suitable types of materials and thicknesses may also be useful.

Figure 1C:
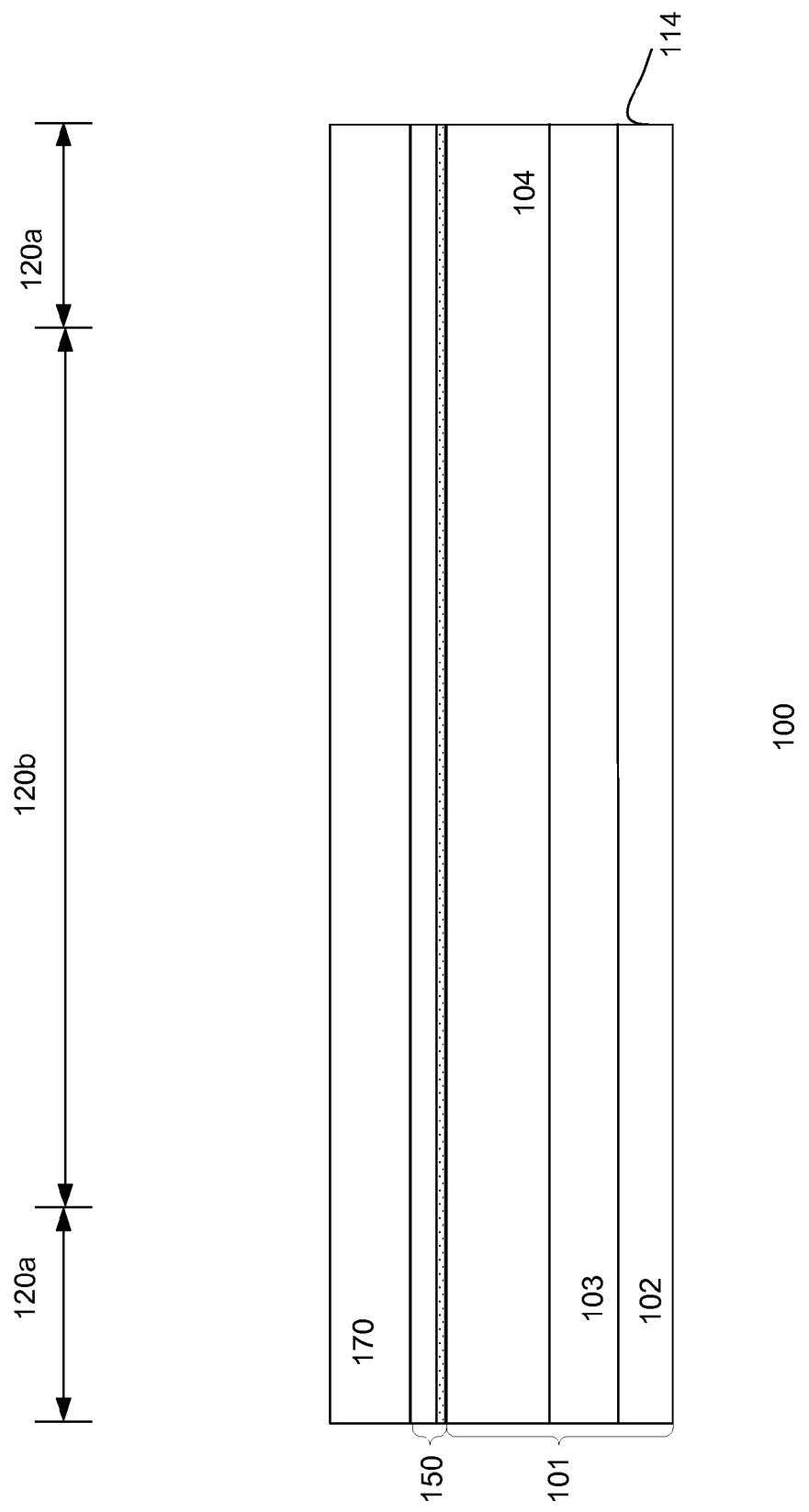

As shown in FIG. 1c, a soft mask layer 170 is provided on top of the hard mask stack. The soft mask, for example, includes a photoresist. The soft mask has a thickness of about 1500 Å. Other suitable thicknesses may also be useful. Various techniques, such as spin-on, can be used to form the soft mask layer. A reticle (not shown) having a pattern of spaced openings corresponding to the trenches in the substrate is disposed above the soft mask layer. The soft mask layer is exposed using a radiant source of a photolithography system which passes through the reticle, creating an optical image of the reticle pattern.

Figure 1D:
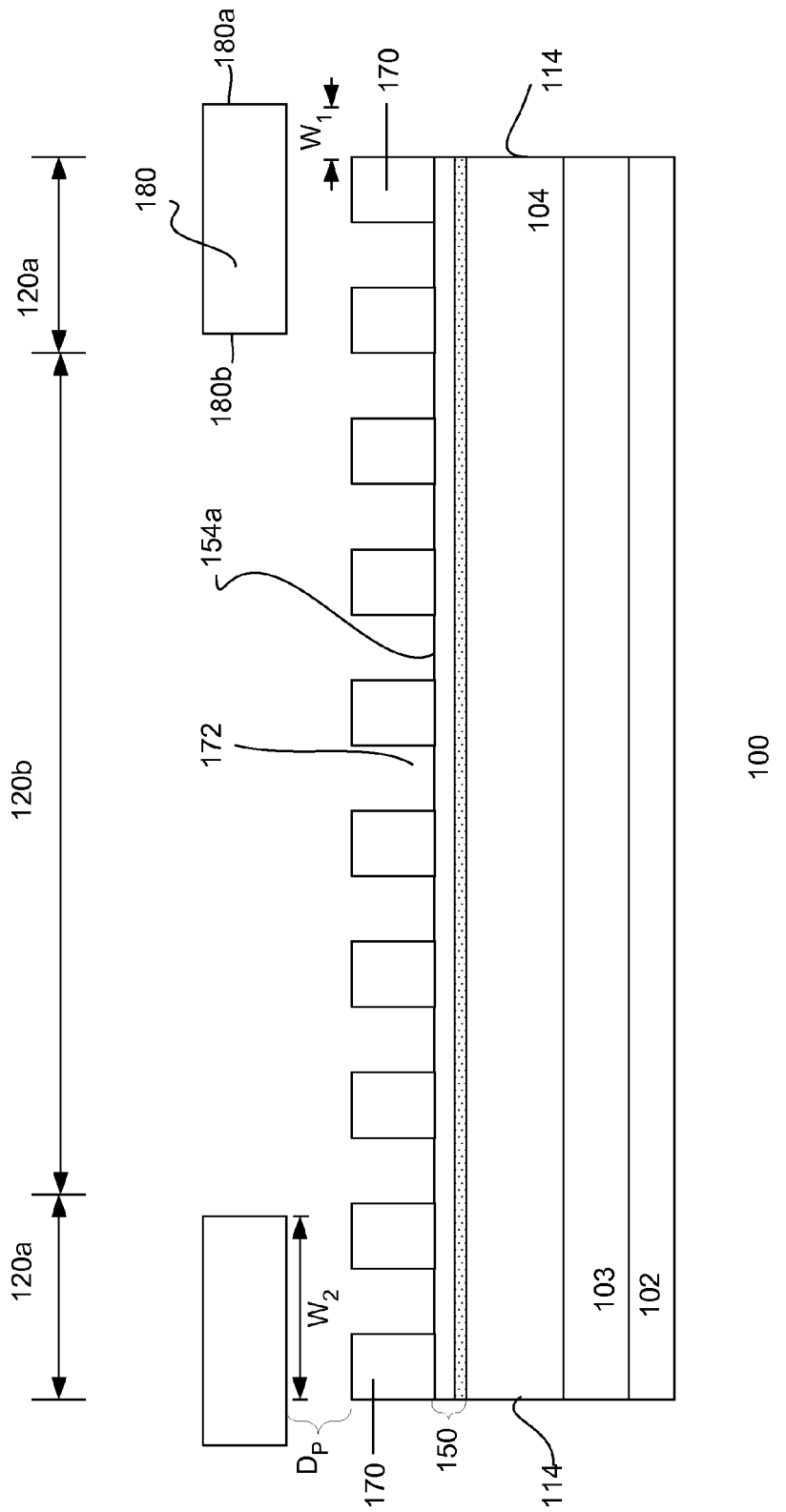

Referring to FIG. 1d, the soft mask is patterned to create openings 172 in the substrate corresponding to locations where trenches for ICs are to be formed. Patterning the soft mask layer includes developing or removing exposed or unexposed portions of the soft mask layer, depending on whether a positive or negative resist is used. The portions of the soft mask layer, for example, are removed by a developer/rinse system. Other suitable techniques for removing the soft mask portions may also be useful. The openings in the soft mask layer expose portions of the hard mask stack. For example, the openings in the soft mask layer expose portions 154a of the second pad layer, such as silicon nitride of the hard mask stack. In one embodiment, the openings have the same width. Providing openings with different widths may also be useful.

The substrate with the layers as described above is at the stage of processing just prior to forming a plurality of trench structures in the substrate. In one embodiment, the trench structures include trenches for forming isolation regions such as shallow trench isolation (STI) regions. Other types of trench structures may also be useful.

The substrate with the layers thereon is loaded into an etch tool (not shown) for processing. The etch tool, for example, is a plasma reaction chamber. Other types of etch tool may also be useful.

In one embodiment, a protection unit 180 is provided in the etch tool as shown in FIG. 1d. The protection unit, as shown, is placed above the wafer. The protection unit, in one embodiment, is placed above the soft mask layer and is separated by a distance $D_P$. The distance $D_P$, for example, may range from 0.1-2 mm. Other suitable distances may also be useful. Such arrangement of the protection unit is advantageous as it prevents soft mask poisoning or deformation of the underlying soft mask layer, which may be difficult to be removed during subsequent processing. In other embodiments, the protection unit may also contact the soft mask layer. The protection unit, for example, is made of metal, $SiO_2$ or other ceramic materials. Any other suitable materials, such as those which would not affect the plasma performance at the wafer edge, easy to clean and minimize generation of particles, may also be used.

Figure 2:
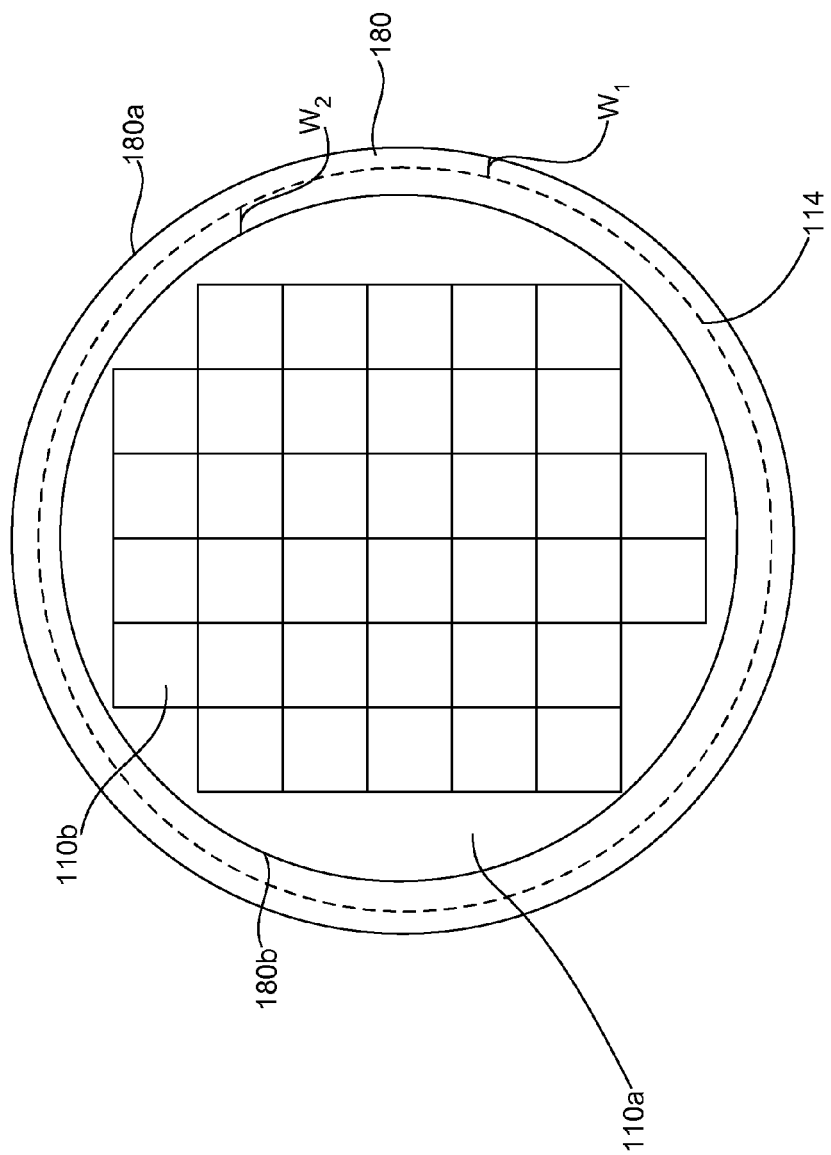
FIG. 2 shows a top view of an embodiment of an arrangement of a protection unit with respect to a wafer.

FIG. 2 shows a top view 200 of an embodiment of an arrangement of the protection unit with respect to the wafer substrate. In one embodiment, the protection unit includes a ring structure. Providing a protection unit having other shapes may also be useful.

As shown in FIG. 1d and FIG. 2, the ring structure, for example, includes an outer ring 180a and an inner ring 180b. The outer and inner rings, as shown, are circular. Providing the inner ring with other shapes may also be useful. For example, the inner ring may have a shape which follows the outermost edges of the functional chips. The outer ring has a larger diameter and encircles the inner ring. The region between the outer ring and the inner ring has a total width $W_T$ which is sufficiently wide to at least protect the first region 120a of the substrate during processing. The total width $W_T$, for example, includes a first width $W_1$ of a first region and a second width $W_2$ of a second region of the ring structure.

In one embodiment, the outer ring of the ring structure extends outward in a radial direction from the circumferential edge 114 of the wafer with a distance corresponding to the first width $W_1$ of the first region of the ring structure. The first width $W_1$, for example, may range from 1-5 mm. Other suitable dimensions for the first width $W_1$ may also be useful. Such arrangement is advantageous as it effectively or fully protects the wafer edge from being etched during an etch process later. In another embodiment, the outer ring of the ring structure aligns with the circumferential edge 114 of the wafer.

The second region of the ring structure, for example, covers a radial distance extending from the circumferential edge 114 of the wafer toward the inner region of the substrate and aligns at about the inner ring 180b of the ring structure. The radial distance, for example, corresponds to the second width $W_2$ of the ring structure. The second width $W_2$, for example, may range from 0.5-3 mm. The inner ring 180b, as shown, is within the first region 120a. Alternatively, the inner ring 180b may also be aligned (not shown) with the interface between the first region 120a and the second region 120b. Thus, any suitable dimensions for the second width $W_2$ may also be useful, so long as it is sufficiently wide to at least cover a portion of the first region of the wafer substrate 120a which is subject to over polishing in subsequent processing. In other embodiments, the second width $W_2$ may be sufficiently wide to cover the first region 120a of the wafer substrate.

Figure 1E:
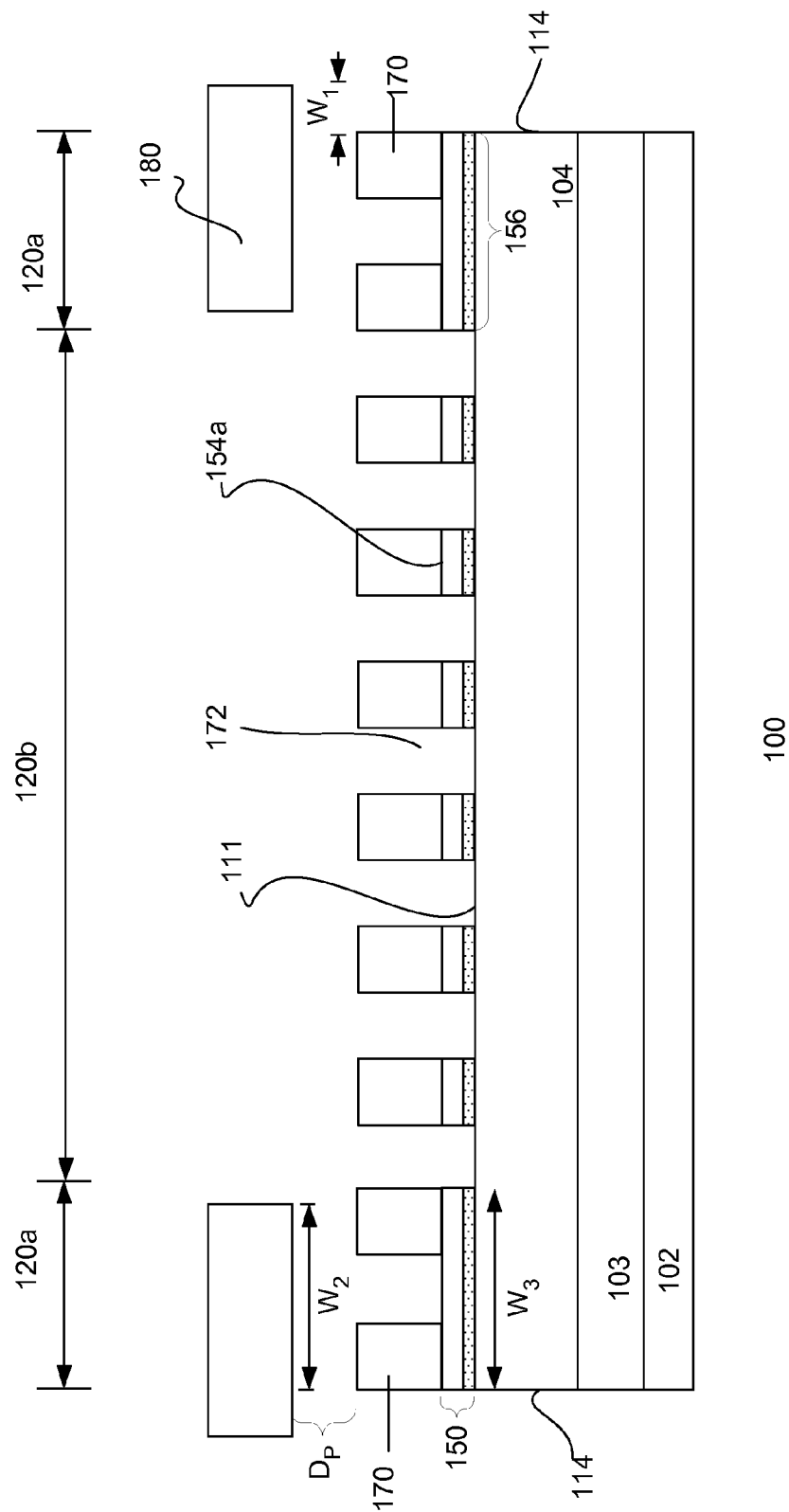

In FIG. 1e, the hard mask stack is patterned, removing portions in the second region 120b of the substrate exposed by the soft mask layer and not protected by the protection layer. The exposed hard mask stack in the second region of the substrate, which includes at least the first and second pad layers may be removed by an etch process. The first and second pad layers, for example, may be removed within one step using one chemical with no selectivity. Alternatively, the removal technique, for example, may employ a two-step etching process. The first step utilizes the first pad layer as an etch stop layer during etching of the second pad layer while the second step utilizes the first surface 111 of the substrate as the etch stop layer during etching of the first pad layer. Other suitable techniques may also be useful. Referring to FIG. 1e, the pattern of the soft mask is transferred to the hard mask stack. The patterned hard mask stack forms openings 172 in the second region 120b, exposing the first surface 111 of the substrate.

In one embodiment, peripheral portions 156 of the hard mask stack extending from the edge of the wafer to a radial distance having a width $W_3$ are not removed. The third width $W_3$, for example, may range from 0.5-3.5 mm. Other suitable dimensions for the third width $W_3$ may also be useful, so long as it is sufficiently wide to protect the portions of the substrate beneath the peripheral portions 156 of the hard mask layer. As shown in FIG. 1e, these peripheral portions 156 of the hard mask stack are prevented from being removed and no openings are formed in these peripheral portions of the hard mask stack due to placement of the protection unit as described. As such, the protection unit prevents openings from being formed in these peripheral portions of the hard mask stack.

Figure 1F:
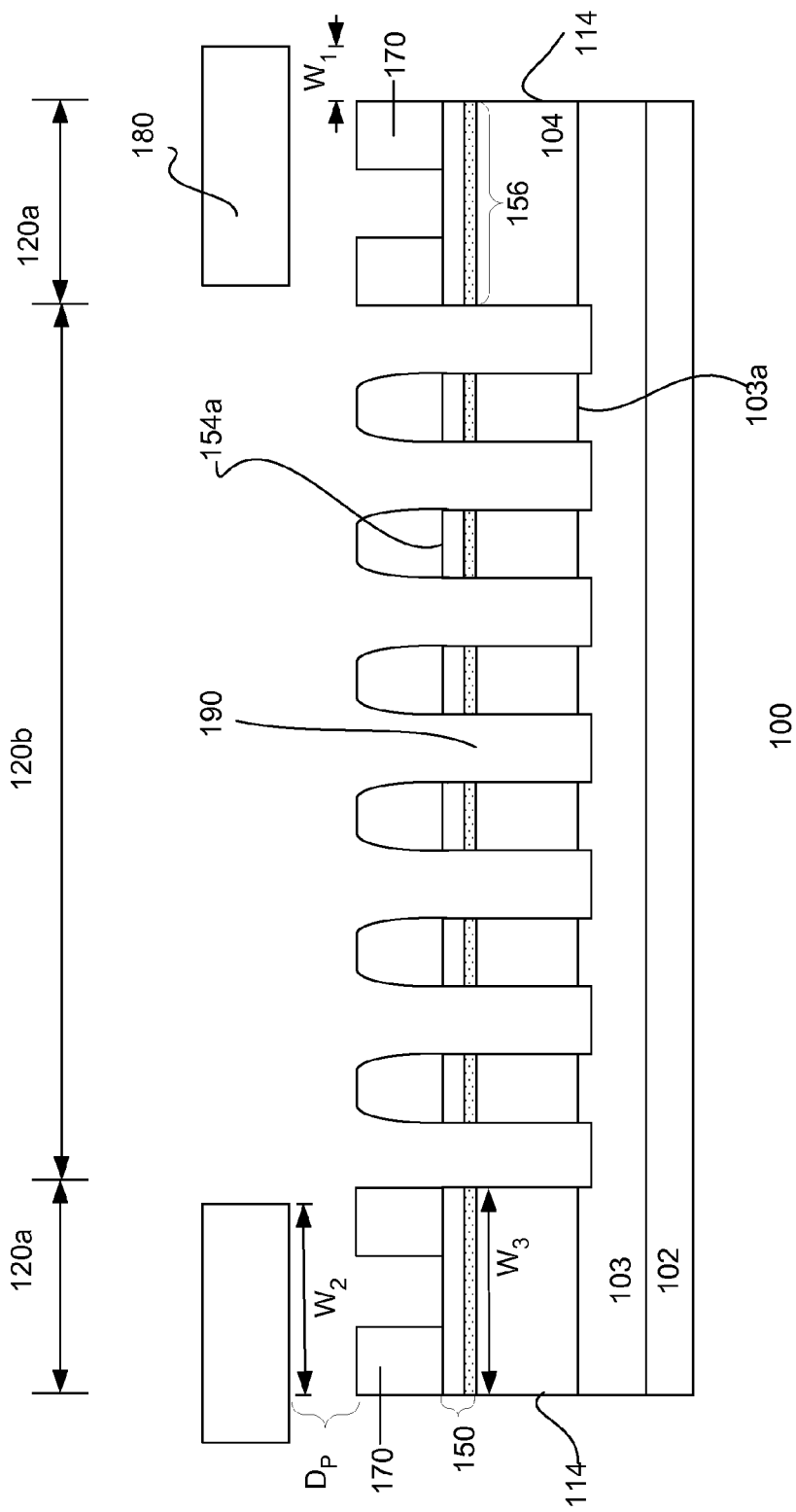

The process continues to form trenches 190 in the second region 120b of the substrate, as shown in FIG. 1f. In one embodiment, the trenches are formed by an etch process. In one embodiment, the etch form trenches in regions unprotected by the hard mask stack. The etch may include a selective anisotropic etch, such as RIE. In one embodiment, the anisotropic etch is a timed etch and is non-selective to the insulator layer 103. As such, only portions of first or top surface 103a of the insulator layer are exposed. The exposed portions of first or top surface 103a of the insulator layer may be overetched, forming recesses in the insulator layer as shown in FIG. 1f. Other suitable techniques may also be employed to form the trenches.

In one embodiment, the trenches include vertical sidewall profiles, as shown in FIG. 1f. Providing non-vertical sidewall profiles, such as trenches having angled sidewalls may also be useful. This can be achieved by tuning the etch chemistry or other suitable techniques. The non-vertical sidewalls (not shown), for example, allow trenches to be easily filled.

As shown in FIG. 1f, the soft mask remains during etching of the trenches in the second region of the substrate. The soft mask gets eroded during selective etching of the trenches. Depending on the thickness of the soft mask, it may be completely or partially eroded. In the case of complete erosion of the soft mask, the exposed hard mask may also get partially eroded. There should be sufficient amount of hard mask (e.g., silicon nitride) remaining to serve as a polish stop for subsequent processes. By not removing the soft mask, a thinner hard mask layer can be used. In alternative embodiments, the soft mask may be removed prior to etching of the substrate to form the trenches.

Figure 1G:
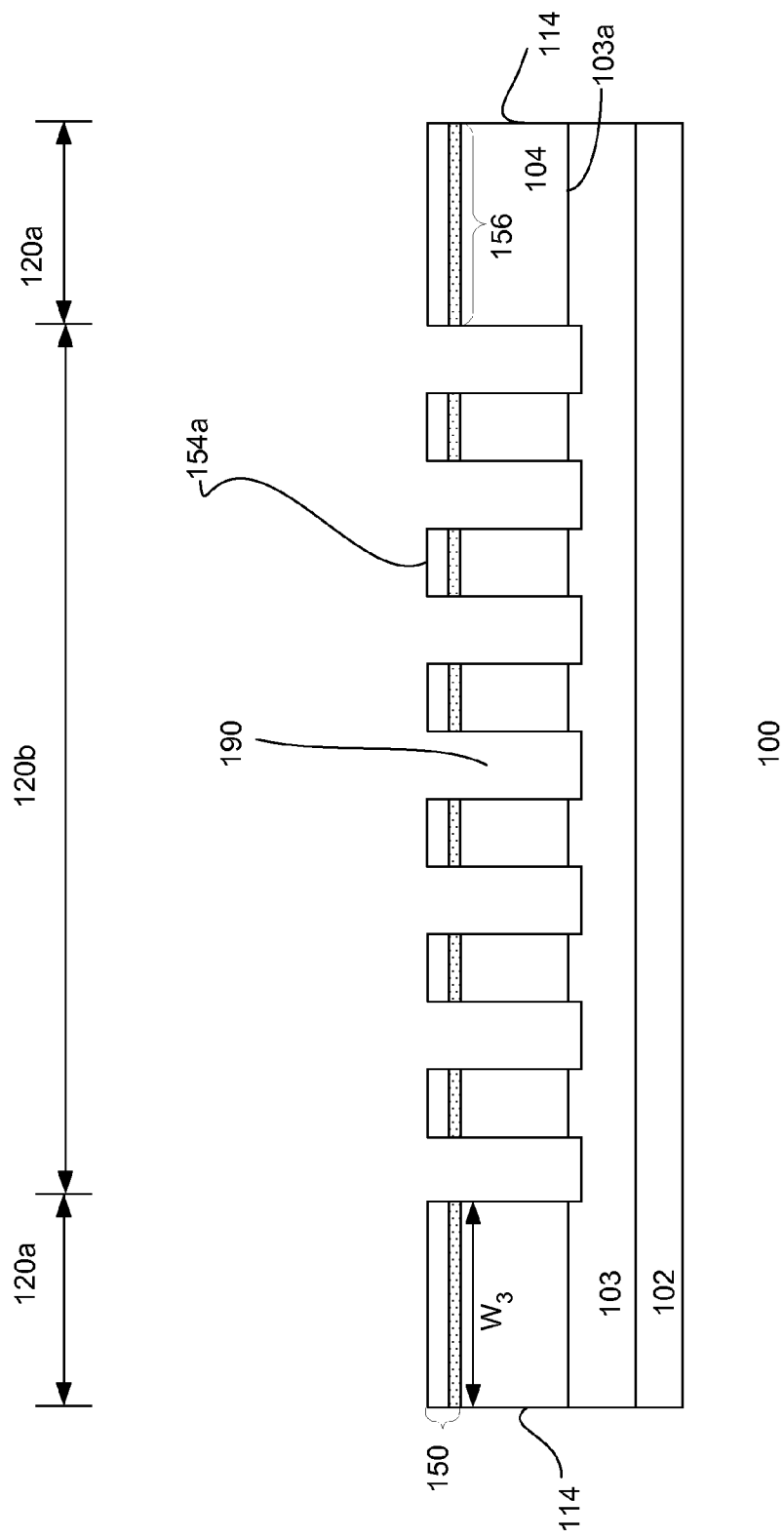

The process continues to remove the soft mask materials as shown in FIG. 1g. The remaining soft mask materials, for example, are removed by a plasma strip process. The soft mask materials may be removed in the same etch tool or in a separate tool. As described earlier, the soft mask materials, for example, may also be removed during selective etching of the trenches. Other suitable techniques may also be useful.

Referring to FIG. 1h, the trenches are filled with a fill material 192. For example, if the trenches are STI trenches, the fill material includes a dielectric material. A liner layer can be formed on the substrate, lining the trench sidewalls to relieve stress and repair etching damage to the silicon substrate. The liner, for example, includes silicon oxide. The liner can be formed by, for example, silicon oxynitride (SiON) or a $Si_3N_4/SiO_2$ hybrid. An insulating layer is then deposited on the substrate, filling the trenches. In one embodiment, the insulating layer includes a HARP material, such as $SiO_2$. Any suitable techniques may be employed to fill the trenches. In addition, other types of fill materials are also useful, depending on the type of the trench structure.

Figure 1I:
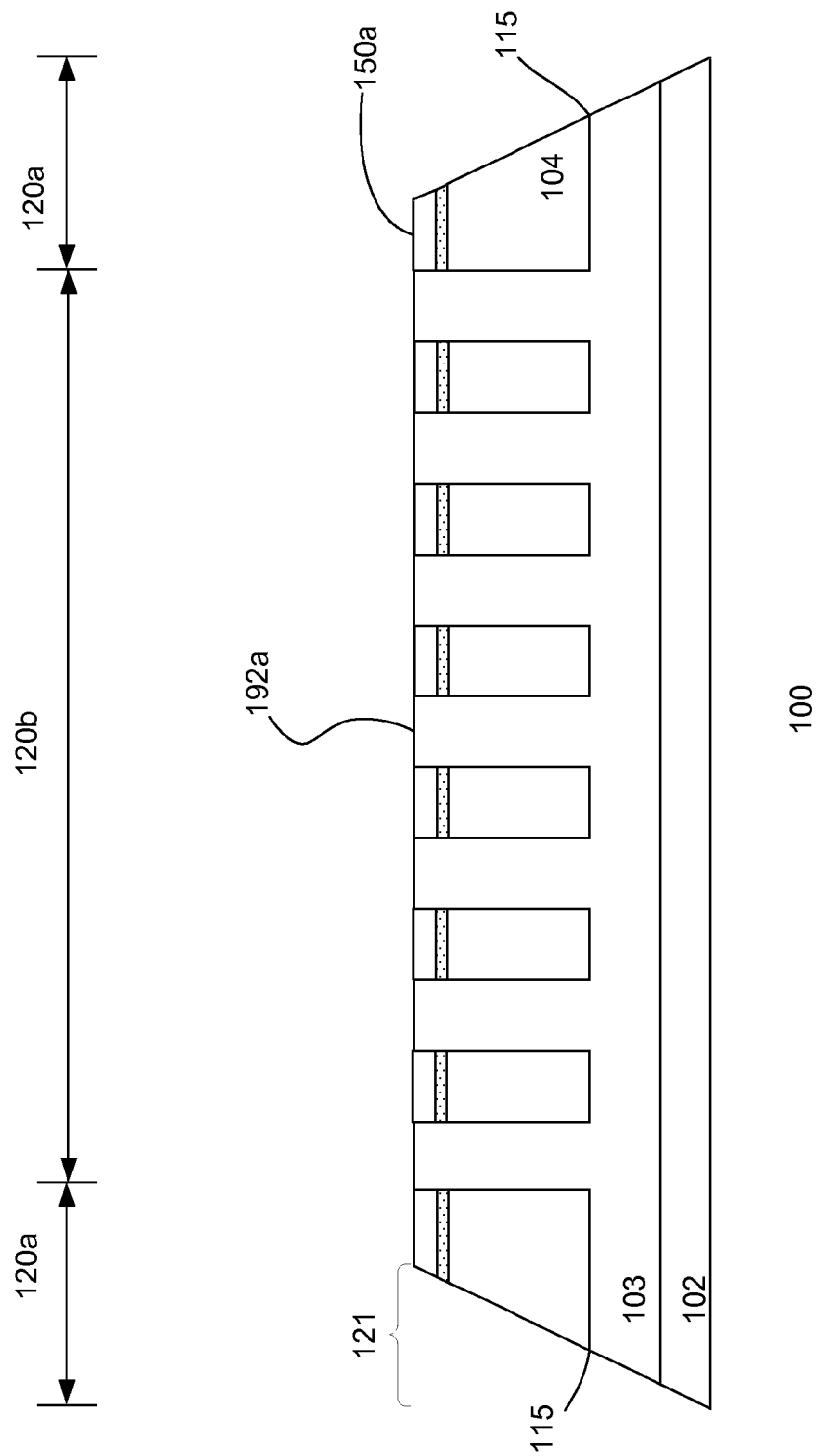

The process continues by removing the excess fill material. The excess fill material is removed by, for example, chemical mechanical polishing (CMP) process, producing trench structures in the second region 120a of the wafer substrate having top surfaces 192a which are about co-planar with the top surface 150a of the hard mask stack. As shown in FIG. 1i, the polishing rate of a portion of the first region of the wafer substrate 120a which extends from the wafer edge 114 towards the inner region of the substrate is higher than the polishing rate of the second region 120b of the wafer substrate. As such, a portion of the first region 121 of the wafer substrate is over polished, producing inclined side surfaces 115 at the wafer edge.

The remaining hard mask stack 150 is removed, as shown in FIG. 1j. The second pad layer 154 of the hard mask stack is removed. For example, the second pad layer is removed by $H_3PO_4$, exposing the first pad layer 152. Other suitable techniques may also be used to remove the second pad layer. The first pad layer, for example, protects the underlying substrate from contamination during the removal of the second pad layer. A cleaning process using, for example, a HF or DHF solution is performed to remove the remaining first pad layer, exposing the top surface 111 of the wafer substrate. In situations where, for example, the first pad layer and the fill material include the same material, such as $SiO_2$, a portion of the fill material in the STI trenches may also be removed during the cleaning process as shown in FIG. 1j. This may result in STI structures having top surfaces which are slightly above (194a) or being substantially coplanar (dotted line 194b) with the top surface 111 of the wafer substrate. Other suitable techniques may be employed to remove the first pad layer.

After the trench structures are completed, processing of the substrate continues to complete the IC.

The process and the protection unit, as described with respect to FIGS. 1a-j and 2, result in advantages. As described, the protection unit 180 protects at least the first region 120a of the wafer substrate from being removed during an etch process. As a result, no trench structures are formed in this region. We have discovered that by having this region devoid of trench structures, the substrate material in this region, for example, the crystalline surface layer in this region, remains intact even after the polishing and cleaning processes as described above. In other words, even though a portion of the first region of the wafer substrate 120a which extends from the wafer edge 114 towards the inner region of the substrate is polished at a higher rate relative to the second region 120b of the wafer substrate during a polishing process and the first pad layer of the hard mask stack is removed subsequently by the cleaning process, the crystalline surface layer in this region remains undetached. This effectively prevents or suppresses generation of substrate particles from this region and therefore avoids distribution of substrate particles across the wafer during subsequent processing. Accordingly, no contamination of wafer occurs thereby improve manufacturing yield and improves reliability of the devices formed later. Moreover, the process as described provides a simplified method to effectively prevent contamination across the wafer without the need to modify the polishing process or the need to remove contamination.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
providing a wafer substrate having first and second regions, wherein the second region includes an inner region of the substrate while the first region includes an outer peripheral region from an edge of the substrate towards the inner region;
providing a hard mask stack over the wafer substrate;
providing a soft mask over the hard mask stack, wherein the soft mask having a pattern corresponding to at least one trench to be formed in the substrate;
providing a protection unit above the substrate, wherein the protection unit includes a region having a total width $W_T$ defined by outer and inner rings of the protection unit and wherein $W_T$ of the protection unit comprises a first region having a first width $W_1$ and a second region having a second width $W_2$; and
etching the substrate to form the at least one trench in the second region of the substrate, wherein the $W_T$ of the protection unit is sufficiently wide to protect the first region of the wafer substrate such that the first region is devoid of trench.

2. The method of claim 1 wherein the substrate comprises a crystalline-on-insulator (COI) substrate.

3. The method of claim 1 wherein the protection unit is provided above the soft mask and is separated from the soft mask by a distance $D_P$.

4. The method of claim 3 wherein $D_P$ is about 0.1 to 2 mm.

5. The method of claim 3 wherein the protection unit comprises metal, $SiO_2$ or ceramic materials.

6. The method of claim 1 wherein the protection unit contacts the soft mask.

7. The method of claim 1 comprises aligning the outer ring of the protection unit with the edge of the substrate.

8. The method of claim 1 wherein the outer ring of the protection unit extends outward in a radial direction from the edge of the substrate which corresponds to $W_1$ of the first region and $W_2$ of the second region of the protection unit covers a radial distance extending from the edge toward the inner region of the substrate and aligns at about the inner ring of the protection unit.

9. The method of claim 8 wherein $W_2$ is sufficiently wide to at least cover a portion of the first region of the substrate which is subject to over polishing in subsequent processing.

10. The method of claim 1 comprising:
patterning the soft mask to create an opening in the second region of the substrate corresponding to a trench where a trench structure is formed; and
patterning the hard mask stack.

11. The method of claim 10 comprising:
removing the soft mask after etching the substrate; and
providing a fill material to fill the trench to form the trench structure.

12. The method of claim 11 wherein the fill material comprises a dielectric material and the trench structure comprises a shallow isolation trench (STI) structure.

13. The method of claim 12 comprising:
performing a polishing process to remove excess fill material to produce the trench structure in the second region of the substrate having a top surface which is coplanar with a top surface of the hard mask stack while the first region of the substrate is over polished, producing inclined surfaces at the edge of the substrate.

14. A method for forming a device comprising:
providing a wafer substrate having first and second regions, wherein the second region includes an inner region of the substrate while the first region includes an outer peripheral region from an edge of the substrate towards the inner region;
providing a hard mask stack over the wafer substrate;
providing a soft mask having a pattern corresponding to a trench to be formed in the substrate over the hard mask stack;
providing a protection unit above the soft mask, wherein the protection unit includes a region having a total width $W_T$ defined by outer and inner rings of the protection unit and wherein the outer ring of the protection unit extends outward in a radial direction from the edge of the substrate which corresponds to $W_1$ of the first region and $W_2$ of the second region of the protection unit covers a radial distance extending from the edge toward the inner region of the substrate and aligns at about the inner ring of the protection unit; and
etching the substrate to form at least a trench in the second region of the substrate, wherein the $W_T$ of the protection unit is sufficiently wide to protect the first region of the wafer substrate such that the first region is devoid of trench.

15. The method of claim 14 wherein:
providing the soft mask having the pattern comprises patterning the soft mask to form at least an opening in the second region of the substrate corresponding to the trench, wherein patterning the soft mask exposes a portion of the hard mask stack; and comprising
patterning the hard mask using the patterned soft mask, wherein the protection unit is provided over the soft mask after patterning the soft mask and before patterning the hard mask.

16. The method of claim 15 wherein the protection unit prevents openings from being formed in peripheral portions of the hard mask stack which extend from the edge of the substrate to the first region of the substrate.

17. The method of claim 14 wherein the first region of the substrate defines a non-functional chip region of which non-functional integrated circuits (ICs) are to be formed while the second region of the substrate defines a chip region of which functional ICs are to be formed.

\* \* \* \* \*